(12) United States Patent
Kroenke et al.

(10) Patent No.: US 7,208,416 B2
(45) Date of Patent: Apr. 24, 2007

(54) METHOD OF TREATING A STRUCTURED SURFACE

(75) Inventors: Matthias Kroenke, Dresden (DE); Thomas Dittkrist, Dresden (DE); Werner Graf, Dresden (DE)

(73) Assignee: Infineon Technologies AG, Munich (DE)

( * ) Notice: Subject to any disclaimer, the term of this patent is extended or adjusted under 35 U.S.C. 154(b) by 92 days.

(21) Appl. No.: 11/043,950

(22) Filed: Jan. 28, 2005

(65) Prior Publication Data

US 2006/0172539 A1    Aug. 3, 2006

(51) Int. Cl.
*H01L 21/302*    (2006.01)
*H01L 21/461*    (2006.01)
*H01L 21/31*     (2006.01)
*H01L 21/469*    (2006.01)
*H01L 21/44*     (2006.01)

(52) U.S. Cl. .............. 438/690; 438/257; 438/655; 438/760

(58) Field of Classification Search ............... 438/690, 438/424, 257, 795, 612, 624, 760, 763, 761
See application file for complete search history.

(56) References Cited

U.S. PATENT DOCUMENTS 6,340,611 B1 * 1/2002 Shimizu et al. ............. 438/201
6,559,027 B2 * 5/2003 Ishitsuka et al. ........... 438/424

* cited by examiner

*Primary Examiner*—Chuong Anh Luu
(74) *Attorney, Agent, or Firm*—Morrison & Foerster LLP

(57) ABSTRACT

The invention provides a simple method of treating a structured surface comprising a higher surface in a first region and a lower surface in the second region. A plurality of layers is deposited on said surface wherein a lower layer exhibits a higher polishing rate than an upper layer and wherein the thickness of the plurality of layers exceeds the step height. Afterwards the plurality of layers is chemically mechanically polished such that the lower layer is at least partly removed in the first region. By this method achieves a better planarization. Additionally, smaller top contact openings after a wet clean step are achievable and a deformation of contact openings due to annealing steps is reduced.

15 Claims, 4 Drawing Sheets

METHOD OF TREATING A STRUCTURED SURFACE

TECHNICAL FIELD OF THE INVENTION

The present invention relates to a method of treating a structured surface.

BACKGROUND OF THE INVENTION

During the manufacturing of semiconductor devices a multiplicity of layers is deposited on a substrate and subsequently structured in order to form semiconductor structures alike transistors, capacitors and resistors. This results in an uneven surface of the substrate due to spaces between these semiconductor devices and different heights of the semiconductor devices. Many manufacturing steps, for example wiring of the semiconductor devices, demand for even surfaces thus intermediate steps for planarizing the structured surfaces are necessary.

U.S. Pat. No. 6,048,475 teaches a method of filling up narrow spaces having a high aspect ratio with several layers comprising a doped silicate glass wherein a lower layer close to a substrate has a high concentration of boron and subsequently deposited layers a lower boron concentrations. Excess silicate glass is removed by a final mechanical chemical polishing (CMP) step.

With reference to FIG. 1 essential characteristics of a CMP will be explained. A semiconductor structure 2 is arranged in a first region 301 of a main surface of a substrate 1 and no structures in a second region 302. In order to planarize this step like surface this arrangement is covered with a silicon glass layer 3 and subsequently a CMP step is applied. The planarity of the remaining structure is improved (FIG. 2). However, the obtained planarity does not meet the requirements of present semiconductor manufacturing steps as the level of the surface in the second region 302 is lower than in the first region.

U.S. Pat. No. 6,146,975 teaches a method of forming a planar wafer by a chemical mechanical polishing. Two kinds of stop layers are applied to the structured surface prior the CMP in order to compensate for different removal rates of the CMP. The stop layers need to be structured by lithographic and etch steps.

U.S. Pat. No. 6,248,667 B1 teaches a method of forming a planar surface using two polishing stop layers wherein a first CMP step is terminated when uncovering the upper of the two polishing stop layers, afterwards the upper polishing stop layer is removed by an etch step, and a subsequent second chemical mechanical polishing step is terminated when uncovering the lower polishing stop layer.

It is an object of the present invention to provide a simplified method of treating a surface of a substrate with a reduced amount of necessary processing steps. A further object is to provide a method of treating a surface of a substrate which is indifferent to the distribution of the density of semiconductor structures.

These objects and other objects are achieved by a method with the features of main claim 1.

SUMMARY OF THE INVENTION

The invention provides a method of treating structured surface comprising a first region and a second region, wherein an average level of height of the surface in the first region is higher than the second region by a step height. A plurality of layers is deposited on said surface wherein a lower layer exhibits a higher polishing rate than an upper layer and wherein the thickness of the plurality of layers exceeds the step height. Afterward, the plurality of layers is polished by a chemical mechanical polishing step such that the upper layer is completely and the lower layer is at least partly removed in the first region.

An advantage of the present invention is that more material is removed in the first region compared to the second region during the chemical mechanical polishing step (CMP). Thus a planarization of the surface will be achieved. The principle of the invention is that at least at one stage the polishing rate is higher in the first region compared to the second region due to the fact that in the first region a lower layer is exposed to the CMP and in the second region still an upper layer is exposed.

In order to facilitate the description of the present invention, a lower layer designates a layer which is closer to the surface of the substrate than an upper layer. Further, the direction of the chemical mechanical polishing is substantially orientated perpendicular towards the surface of the substrate, and thus an uppermost layer is polished first.

Further embodiments of the invention can be found in the dependent claims.

According to a preferred embodiment the plurality of layers comprises two or more different layers.

According to a further preferred embodiment the plurality of layers is made of a single layer with a continuously increasing polishing rate. In order to sustain the language of a plurality of layers said single layer may be regarded as an infinite number of layers wherein a lower layer exhibits a higher polishing rate compared to an upper layer. Advantageously, such a layer can be simply obtained by monotonously decreasing or increasing a concentration of additives to a raw material during the deposition of said raw material for this layer such that the polishing rate decreases.

According to a preferred embodiment the plurality of layers is completely removed in the first region by the chemical mechanical polishing.

According to a preferred embodiment the upper layer is partly removed in the second region by the chemical mechanical polishing.

According to a preferred embodiment the upper layer has a higher glass transition temperature than a layer below this upper layer. By this way structures like contact openings within the second region keep their shape during annealing steps or at least better than without said upper layer.

For another preferred embodiment an upper layer is used having a lower etching rate to an etching agent compared to a lower layer. For example, for contact opening formation and a subsequent wet clean step smaller contact openings in the second region are achievable.

According to a preferred embodiment the layers comprise a silicon oxide glass, wherein a boron concentration in the lower layer is higher than in the upper layer.

According to a preferred embodiment an upper layer comprises a nitride and a lower layer comprises silicon oxide.

According to a preferred embodiment an upper layer comprises a silicon oxide and a lower layer a low-k dielectric.

According to a preferred embodiment contact openings are formed in the plurality of layers such that contact pads on the substrate become exposed.

According to a preferred embodiment an annealing step is processed after the deposition of the layers.

According to a preferred embodiment a cell structure of a memory device is arranged in the first region and a logic structure is arranged in the second region.

According to a preferred embodiment an arrangement of semiconductor structures with a high density is arranged in the first region defining the average height level of the surface in the first region. According to a further preferred embodiment the density of semiconductor structures in the second region is lower than in the first region.

BRIEF DESCRIPTION OF THE DRAWINGS

The above features and advantages of the present invention will become more apparent by describing in detail preferred embodiments thereof with reference to the attached drawings in which.

DESCRIPTION OF THE PREFERRED EMBODIMENTS

In the figures same reference signs refer to identical means or means with identical functionality.

Figure 1:
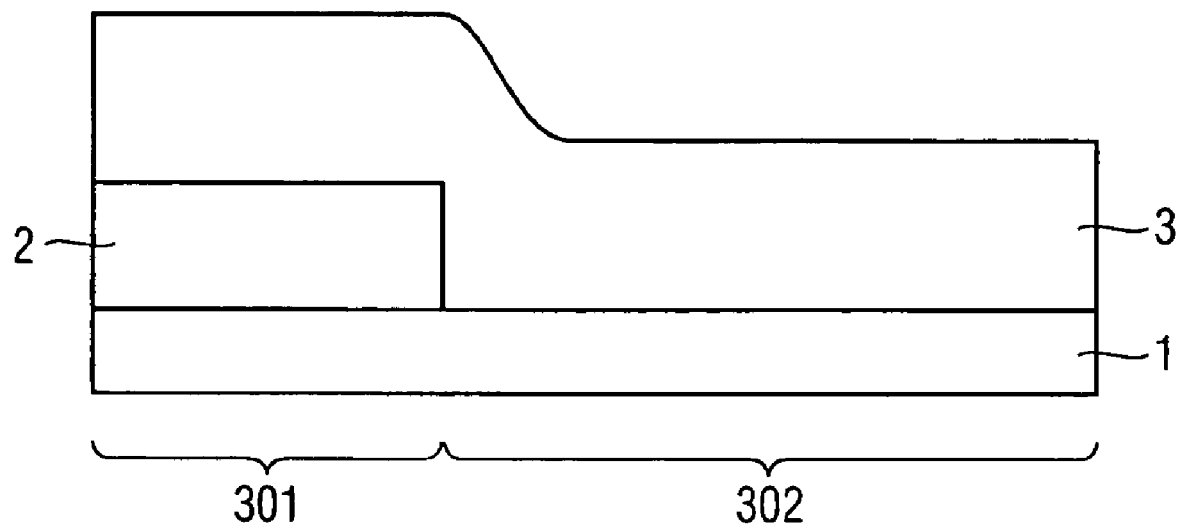
FIGS. 1 and 2 are partial cross sections to demonstrate the underlying problem of the technical field.
Figure 2:
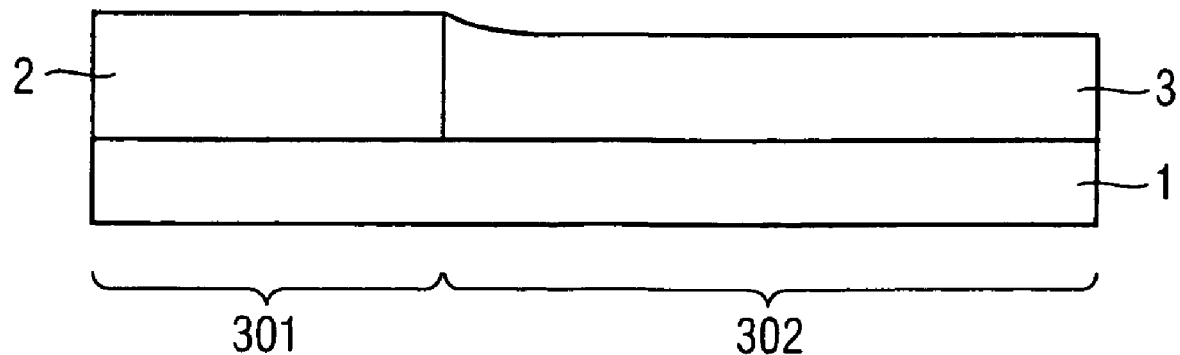
Figure 3:
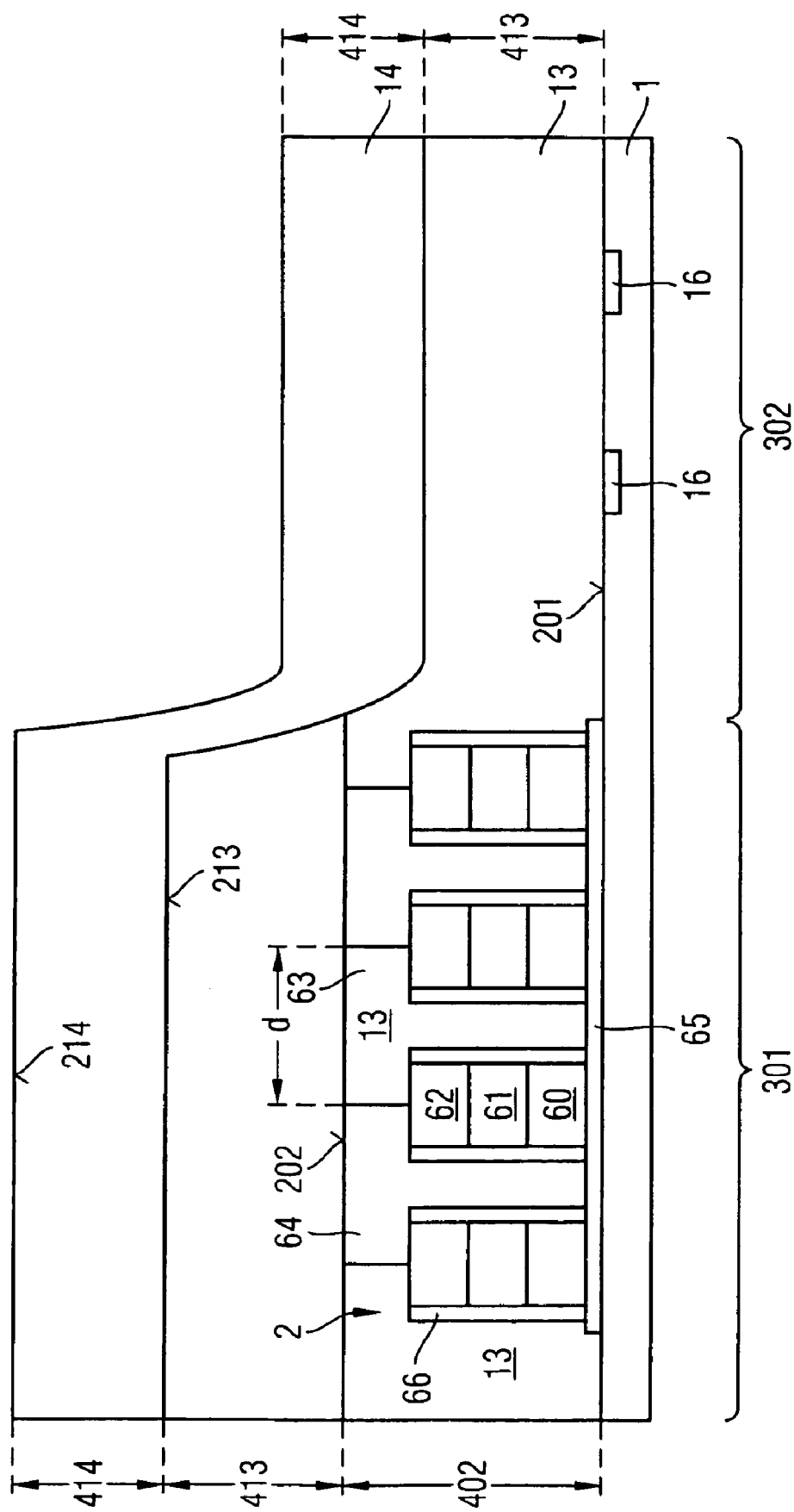
FIGS. 3 and 4 are partial cross sections illustrating steps of one preferred embodiment of the present invention.

FIG. 3 illustrates schematically a partial cross section of a semiconductor substrate 1, a main surface 201 having a first region 301 and a second region 302. The integration density of the semiconductor structures 2 in the region 301 is very high. In contrast, there are no or just a few semiconductor structures arranged in the adjacent second area 302. The first region 301 may correspond to a cell area with structures comprising a stack of gate oxides 65, polysilicon 60, metallized silicon 61 and a nitride cap 62, spacers 66 arranged at the stack bit, and bit line contacts 64; and the second region 302 corresponds to a logic area of a DRAM, for example. Annealing steps with temperatures above the glass transition temperature of the first material are applied in order to reflow the material and eliminate fill voids. The arrangement of semiconductor structures 2 may be considered as a single structure forming a step-like shape on the substrate 1 with an upper surface 202 with an average level of height 402. The lateral dimensions of the first and second regions 301, 302 are by far larger than the height 402. Accordingly, the second region 302 is as well characterised by an average level of its surface.

A first layer 13 with an upper surface 213 and a thickness 413 is deposited onto the arrangement of semiconductor structures 2 and on exposed parts of the main surface 201. The layer comprises a material with a sufficiently low viscosity during an annealing step in order to fill narrow trenches, which are present in the arrangement of semiconductor structures 2, for example. The thickness 413 of the first layer 13 is smaller than the height 402 of the arrangement of semiconductor structures 2. A minimal thickness 413 is determined by half of a width d of gaps between two semiconductor structures 2, which have to be filled by the first layer 13. The filling properties of the first layer 13 are improved by an annealing step. A second layer 14 with an upper surface 214 is deposited on the first layer 13. A thickness 414 of this second layer may be about 1 μm or smaller. The overall thickness of the layers 13, 14 must be larger than the height 402 such that the surface 214 of second layer 14 in the second region 302 exceeds at least partly the surface 202 of the semiconductor structures 2.

The first layer 13 is made of a first material which exhibits a higher polishing rate in a CMP compared to a second material of which the second layer 14 is made. In one embodiment of this invention the first material comprises a silicate glass with a high boron concentration, whereas the second material comprises a silicate glass with a lower boron concentration. Other material combinations are a silicon oxide as first material and a nitride as second material or a low-k dielectric as first material and a silicon oxide as second material.

Figure 4:
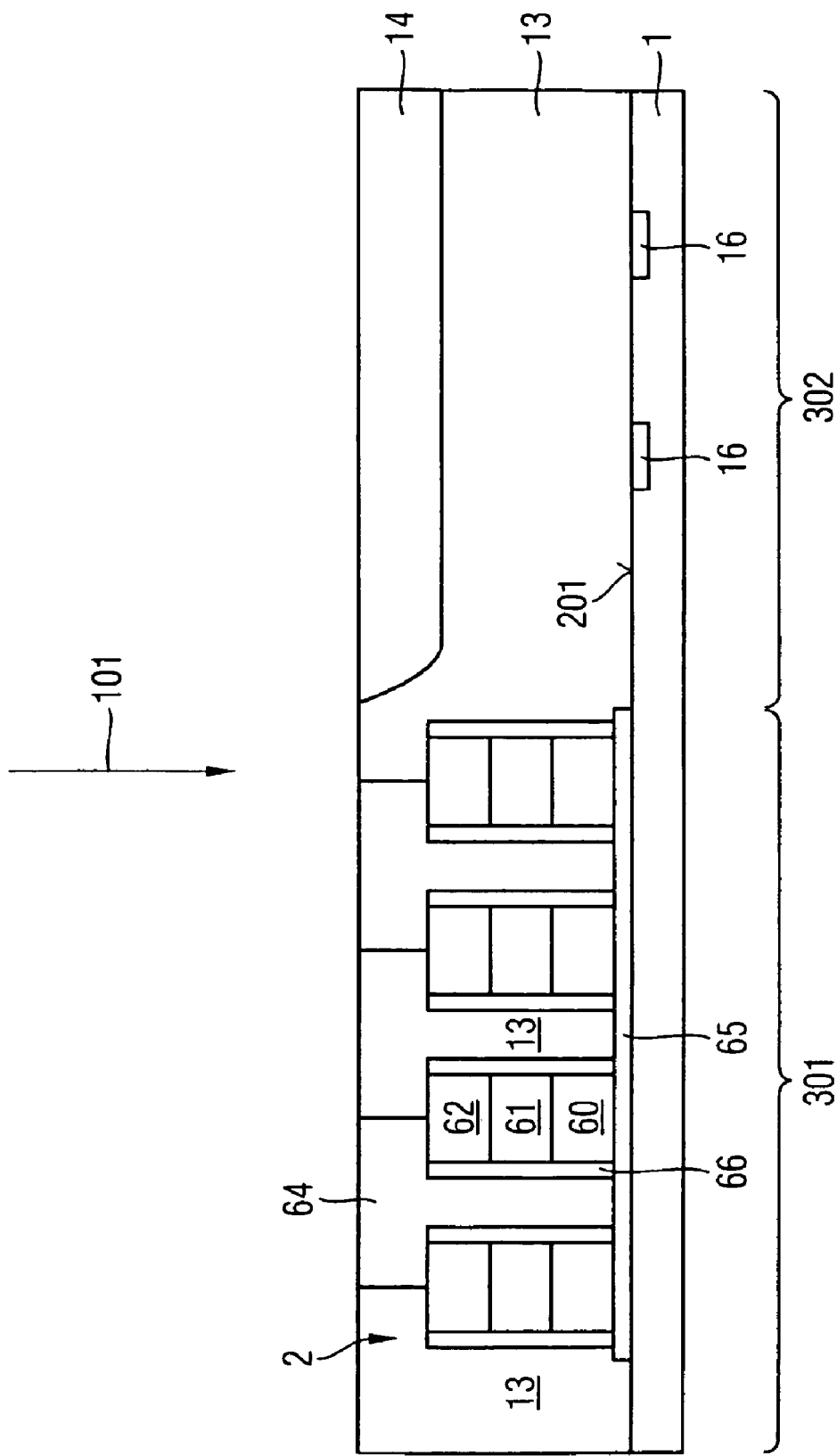

With reference to FIG. 4, a schematic partial cross section depicts the arrangement after a polishing step. The second layer 14 and the first layer 13 are chemically mechanically polished in a direction pointing towards the surface of the substrate 1 as indicated by the arrow 101. Initially, the pressure of a polishing pad upon the more elevated first region 301 is higher than on the second region 302. This leads to a higher polishing rate of the second layer 14 in the first region 301 compared to the second region 302. Should the CMP be stopped in this stage the surface level in the second region 302 would be a bit lower than the surface level in the first region 301 as known from conventional CMP.

As the CMP continues and the level of the surface is closer to the main surface 201, the CMP starts to polish the first layer 13 in the first region 301 and still polishes the second layer 14 in the second region 14. As mentioned before the polishing rate of the first layer 13 is higher compared to the one of the second layer 14. Thus more material per unit area is removed in the first region 301. The effects of conventional CMP causing overpolishing in the second region 302 are compensated and the levels of the surfaces in the first and second region 301, 302 become equal. The CMP may be stopped when the surface 202 of the semiconductor arrangement is exposed as depicted in FIG. 4 or the surface 202 may be left covered by a remaining part of the first layer 13. Further, there may be used more than two layers or one layer with a gradually increasing polishing rate.

Step height reduction is achieved in the state of the art by using very thick covering layers compared to the height of the step. This preferred embodiment uses the difference in the polishing rates in the first and second region allowing to reduce the thickness of the covering layers thus economizing material and time for polishing.

Figure 5:
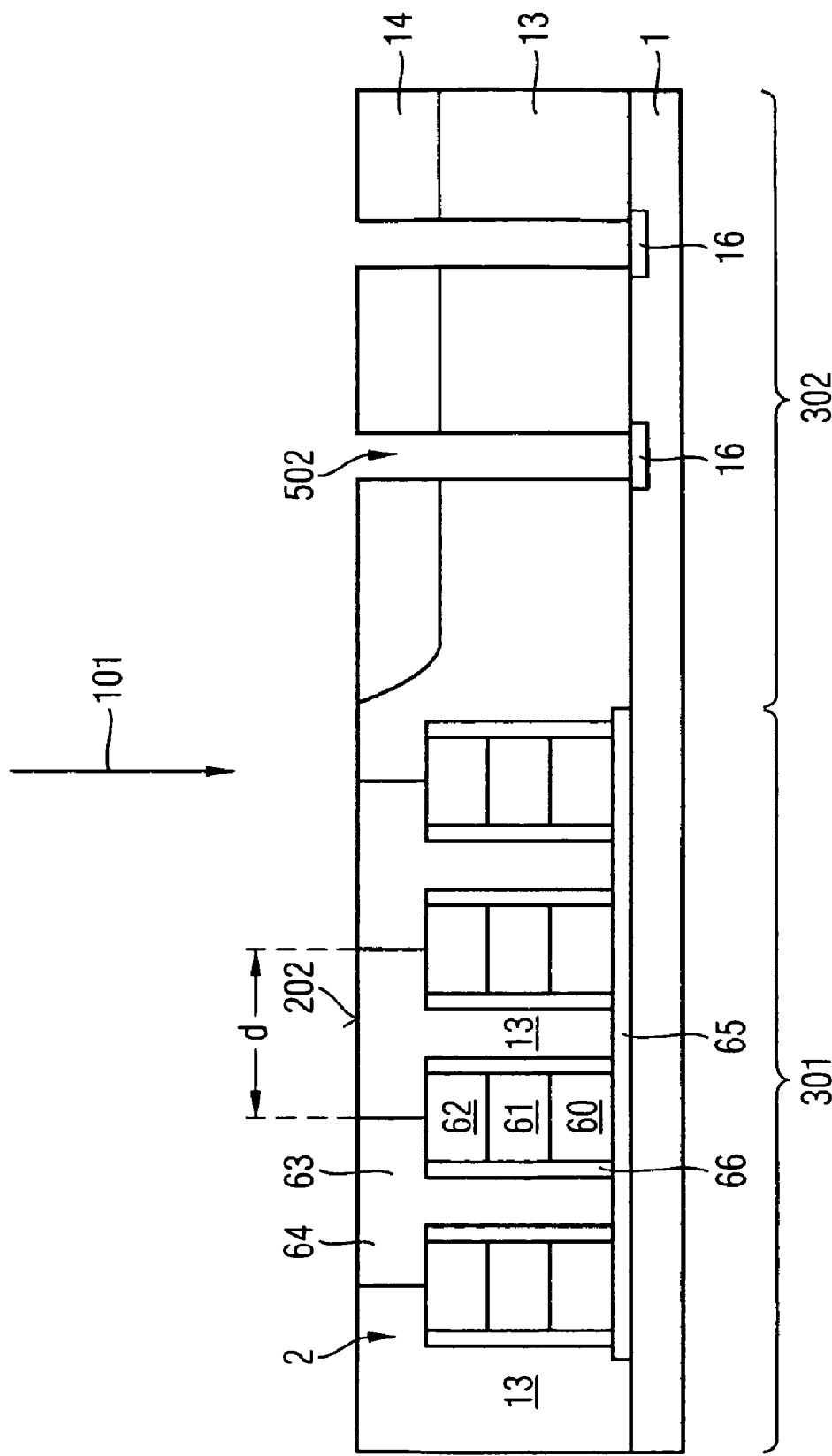
FIG. 5 is a partial cross section of a further embodiment of the present invention.

FIG. 5 demonstrates the creation of contact openings 502 in the deposited layers 13, 14 in the second region 302 over contact pads 16. As already mentioned the first layer 13 has a lower glass transition temperature in order to obtain optimal gap filling properties. During annealing steps or other high temperature steps the first layer 13 reflows within this layer 13 causing deformation to the contact openings 502. The material for the second layer 14 comprises materials with a higher glass transition temperature in order to perform better during the high temperature steps. Thus the remaining part of the second layer 14 stabilizes the lateral position of the contact openings 502. Due to the higher repeatability of the contact openings 502 smaller structure sizes of wiring patterns may be achieved.

Annealing steps may be applied to the structure after the CMP taking into consideration the different glass or melting temperatures of the different materials of the layers 13, 14. Thus the viscosity of the first layer 13 becomes sufficiently low to fill up all small gaps and the second layer remains a mechanical support of the contact openings or other structures.

Advantageously, the viscosity, the glass transition temperature and polishing properties of boron silicate glass or boron phosphor silicate glass are both adjustable by the concentration of the boron concentration. A high boron concentration, preferably more than 4 weight percent, increases the viscosity and the polishing rate making the material suitable for the first layer 301. The glass transition temperature decreases to values of 700° C. Accordingly, the second layer 14 comprises a silicate glass with a low boron concentration. Temperatures for annealing steps are chosen to be in the range of 700° C. to 900° C.

The etching rate of a silicate glass decreases with decreasing boron concentration, in particular for HF containing etch solutions or plasmas. Thus a self aligned masking layer in the second region 302 is obtained which is very useful for subsequent selective etching steps.

Other combinations for the first and second layer are nitride and silicon oxide, silicon oxide and a low-k dielectric, respectively.

REFERENCE SIGNS 1 substrate
2 semiconductor structure
3 layer made of glass
101 polishing direction
13 first layer
14 second layer
16 contact pad
201 main surface
202 surface of 2
213 surface of 13
214 surface of 14
301 first region
302 second region
402 height of 2
413 thickness of 13
414 thickness of 14
502 contact opening

The invention claimed is:

1. A method of treating a structured surface comprising following steps:
   providing a substrate with a structured surface comprising a first region and a second region, wherein an average level of height of the surface in the first region is higher than the second region by a step height;
   depositing a plurality of layers on said surface wherein a lower layer exhibits a higher polishing rate than an upper layer and wherein the thickness of the plurality of layers exceeds the step height; and
   chemical mechanical polishing of the plurality of layers such that the upper is completely and the lower layer is at least partly removed in the first region.

2. The method according to claim 1, wherein the plurality of layers is completely removed in the first region by the chemical mechanical polishing.

3. The method according to claim 1, wherein the upper layer is partly removed in the second region by the chemical mechanical polishing.

4. The method according to claim 1, wherein layers comprise a silicon oxide glass, wherein a boron concentration in the lower layer is higher than in the upper layer.

5. The method according to claim 1, wherein an upper layer comprises a nitride and a lower layer comprises silicon oxide.

6. The method according to claim 1, wherein an upper layer comprises a silicon oxide and a lower layer a low-k dielectric.

7. The method according to claim 1, wherein contact openings are formed into the plurality of layers such that contact pads on the substrate become exposed.

8. The method according to claim 1, wherein an annealing step is processed after the deposition of the layers.

9. The method according to claim 1, wherein an arrangement of semiconductor structures with a high density is arranged in the first region defining the average level of the height of the surface in the first region.

10. The method according to claim 1, wherein a density of semiconductor structures in the second region is lower than in the first region.

11. The method according to claim 1, wherein a cell structure of a memory device is arranged in the first region and a logic structure is arranged in the second region.

12. The method according to claim 1, wherein the plurality of layers is made of two or more separate layers.

13. The method according to claim 1, wherein the plurality of layers is made of one layer with a continuously increasing polishing rate.

14. The method according to claim 1, wherein the upper layer comprises a material with a higher glass transition temperature than a lower layer.

15. The method according to claim 1, wherein a material for an upper layer is chosen such that an etching rate of an etching agent is lower for the upper layer compared to the lower layer.

* * * * *